(12) United States Patent
Meiser et al.

(10) Patent No.: US 9,059,256 B2
(45) Date of Patent: Jun. 16, 2015

(54) METHOD FOR PRODUCING A CONTROLLABLE SEMICONDUCTOR COMPONENT

(75) Inventors: Andreas Meiser, Sauerlach (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 13/614,076

(22) Filed: Sep. 13, 2012

(65) Prior Publication Data

US 2014/0073123 A1 Mar. 13, 2014

(51) Int. Cl.
*H01L 21/8242* (2006.01)
*H01L 21/336* (2006.01)
*H01L 21/76* (2006.01)
*H01L 21/311* (2006.01)
*H01L 21/768* (2006.01)
*H01L 21/28* (2006.01)
*H01L 23/48* (2006.01)
*H01L 21/74* (2006.01)
*H01L 29/40* (2006.01)
*H01L 29/423* (2006.01)
*H01L 29/78* (2006.01)

(52) U.S. Cl.
CPC .... *H01L 21/76877* (2013.01); *H01L 21/28008* (2013.01); *H01L 21/76898* (2013.01); *H01L 23/481* (2013.01); *H01L 21/743* (2013.01); *H01L 2924/0002* (2013.01); *H01L 29/407* (2013.01); *H01L 29/4236* (2013.01); *H01L 29/7827* (2013.01)

(58) Field of Classification Search
USPC ......... 438/243, 245, 248, 259, 270, 427, 700, 438/435; 257/E21.545, E21.546, E21.548, 257/E21.549, E21.551, E21.553
See application file for complete search history.

(56) References Cited

U.S. PATENT DOCUMENTS

| | | | |
|---|---|---|---|
| 7,453,119 B2 * | 11/2008 | Bhalla et al. | 257/330 |
| 7,897,440 B1 * | 3/2011 | Horch | 438/135 |
| 8,120,100 B2 | 2/2012 | Lin et al. | |
| 8,374,986 B2 * | 2/2013 | Indeck et al. | 706/47 |
| 8,399,363 B1 * | 3/2013 | Lee et al. | 438/761 |
| 8,501,561 B2 * | 8/2013 | Zundel et al. | 438/243 |
| 2001/0036705 A1 * | 11/2001 | Nishida et al. | 438/296 |
| 2008/0116511 A1 * | 5/2008 | Zundel et al. | 257/330 |
| 2010/0173470 A1 * | 7/2010 | Lee et al. | 438/427 |
| 2011/0117721 A1 * | 5/2011 | Kim et al. | 438/428 |
| 2011/0254086 A1 * | 10/2011 | Hsieh | 257/330 |

(Continued)

FOREIGN PATENT DOCUMENTS

DE 102005020075 A1 11/2006

*Primary Examiner* — Mohsen Ahmadi
(74) *Attorney, Agent, or Firm* — Murphy, Bilak & Homiller, PLLC

(57) ABSTRACT

Disclosed is a method for producing a controllable semiconductor component. In a semiconductor body with a top side and a bottom side, a first trench protruding from the top side into the semiconductor body and a second trench protruding from the top side into the semiconductor body are formed in a common etching process. The first trench has a first width and the second trench has a second width greater than the first width. Then, in a common process, an oxide layer is formed in the first trench and in the second trench such that the oxide layer fills the first trench and electrically insulates a surface of the second trench. Subsequently, the oxide layer is removed from the first trench completely or at least partly such that the semiconductor body comprises an exposed first surface area arranged in the first trench.

25 Claims, 15 Drawing Sheets

(56) References Cited

U.S. PATENT DOCUMENTS

2012/0012924 A1* 1/2012 Meiser et al. ............ 257/330
2012/0208346 A1* 8/2012 Kadoshima et al. ........ 438/425
2012/0261746 A1* 10/2012 Darwish et al. ............ 257/330

* cited by examiner

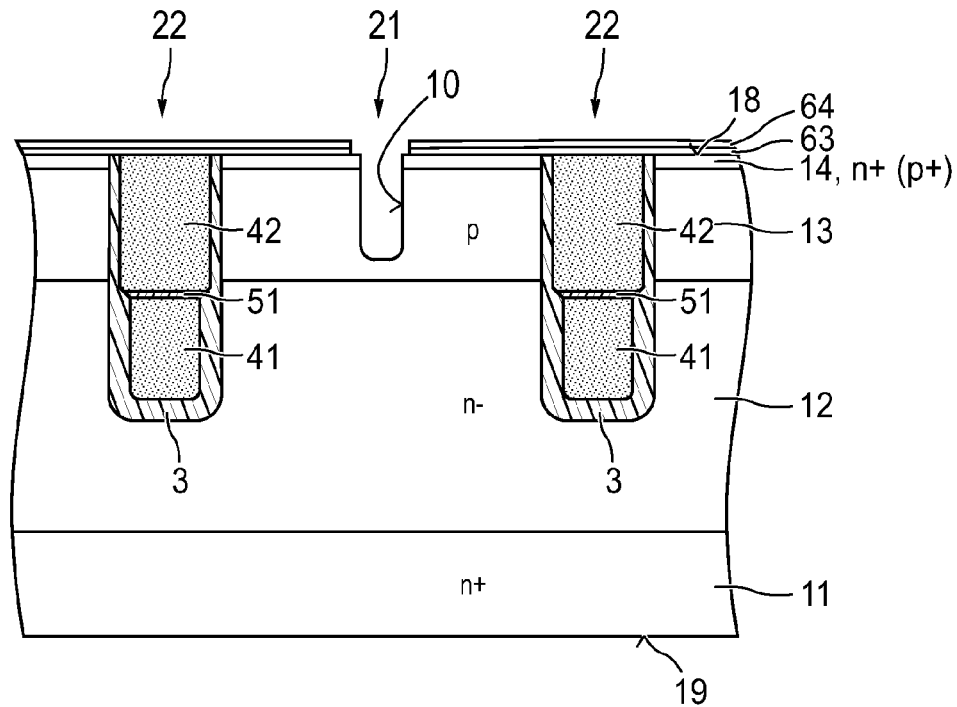
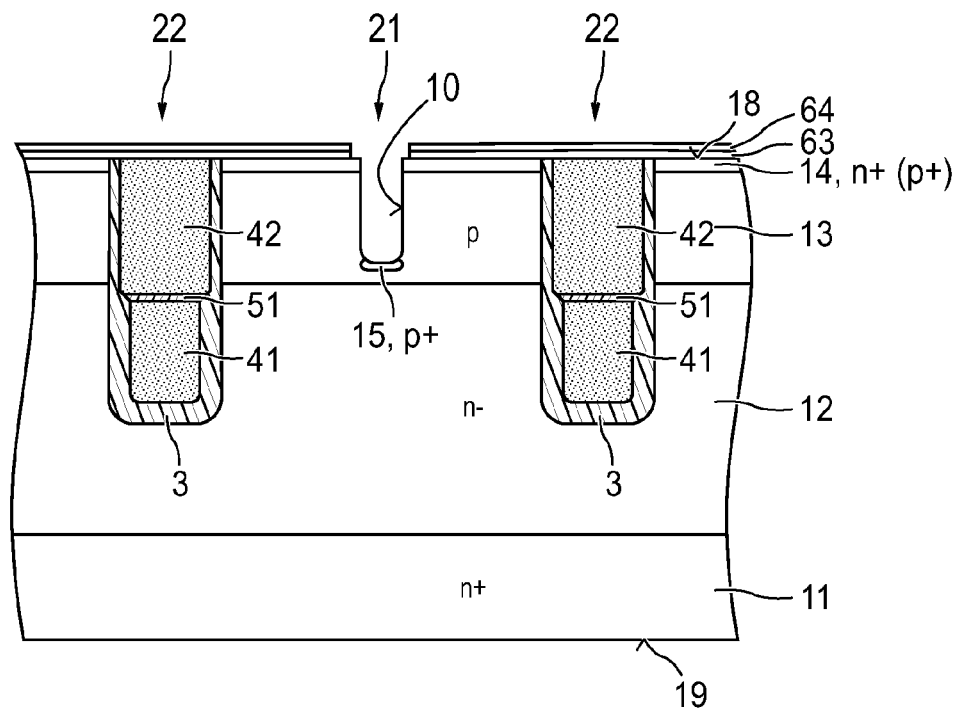

METHOD FOR PRODUCING A CONTROLLABLE SEMICONDUCTOR COMPONENT

TECHNICAL FIELD

Embodiments of the present invention relate to a method for producing a controllable semiconductor component.

BACKGROUND

Controllable semiconductor components like MOSFETs (Metal Oxide Semiconductor Field-Effect Transistors), IGBTs (Insulated Gate Bipolar Transistors), JFETs (Junction Field-Effect Transistors) etc. are widely used as electronic switches for switching electrical loads or as electronic switches in all types of switching converters. Many controllable semiconductor components include a semiconductor body with a drain region, a drift region adjoining the drain region, and a source region, each having a first conductivity type, and a body region arranged between the drift region and source region of a second conductivity type. A gate electrode serves to control a conducting channel in the body region between the source region and the drift region. The source region is electrically connected to a source electrode which is also connected to the body region, and the drain region is electrically connected to a drain electrode.

In order to realize the electrical connection between the source region and the source electrode, in many controllable semiconductor components the source electrode has a protrusion that extends into a trench of the semiconductor body where it contacts the source region. In other controllable semiconductor components, polycrystalline silicon is arranged in a trench of the semiconductor body and electrically contacts both the source region and the source electrode. In both cases, the respective trench is frequently referred to as "contact trench". In conventional methods for producing such a controllable semiconductor component, the contact trench is temporarily sealed with a protective varnish or with polycrystalline silicon so as to allow for the processing of other elements of the semiconductor component to be produced without adversely affecting the source region or the contact trench. However, the mentioned sealing techniques require a number of process steps which on the one hand increase the production costs and on the other hand constrains a reduction of the structure size the like cell pitch of a cell structure of the transistor etc.

Hence, there is a need for an improved method for producing a controllable semiconductor component.

SUMMARY

One aspect relates to a method for producing a controllable semiconductor component. In that method, a semiconductor body with a top side and a bottom side is provided. Subsequently, a first trench protruding from the top side into the semiconductor body and a second trench protruding from the top side into the semiconductor body are formed in a common etching process. The first trench has a first width and a first depth and the second trench has a second width greater than the first width and a second depth greater than the first depth. In a common process, an oxide layer is formed in the first trench and in the second trench such that the oxide layer fills the first trench and electrically insulates a surface of the second trench. By filling the first trench, the oxide layer seals and protects the first trench so that further process steps can be carried out without adversely affecting the first trench or those regions of the semiconductor body adjacent to the first trench. Optionally, the ratio between the second depth and the first depth may be greater than 1.5

A further aspect also relates to a method for producing a controllable semiconductor component. To this, a semiconductor body with a top side and a bottom side is provided. In a common etching process, a first trench protruding from the top side into the semiconductor body, a second trench protruding from the top side into the semiconductor body, and a third trench protruding from the top side into the semiconductor body are formed. The first trench has a first width and a first depth, the second trench a second width and a second depth and the third trench a third width and a third depth. Both the first width and the second width are smaller than the third width, and the first depth is smaller than one or both of the second depth and the third depth. Optionally, the second depth may be greater than the first depth and smaller than the third depth. Optionally, the ratio between the second depth and the first depth may be greater than 1.5. Also optionally, the ratio between the third depth and the first depth may be greater than 1.5 and/or the ratio between the third depth and the first depth may be greater than 1.5.

Then, also in a common oxide layer process, an oxide layer is formed in the first trench, the second and the third trench such that the oxide layer fills the first trench and the second trench and electrically insulates a surface of the third trench. Subsequently, the oxide layer is removed completely or at least partly from the first trench such that the semiconductor body has an exposed first surface area arranged in the first trench.

An advantage of the previously described methods is that an oxide layer forming process required anyway for the production process of the controllable semiconductor component may be used also for sealing at least the first trench. That is, an extra process step for sealing the first trench is unnecessary.

After finishing the further process steps, the oxide layer is removed from the first trench completely or at least partly such that the semiconductor body has an exposed first surface area arranged in the first trench. Optionally, a first electrode may be formed on the top side. Thereby, also an electrical contact between the first electrode and the exposed first surface area may be formed.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIGS. 1-14 illustrate different steps during the production of a controllable semiconductor component.

DETAILED DESCRIPTION

Figure 1:
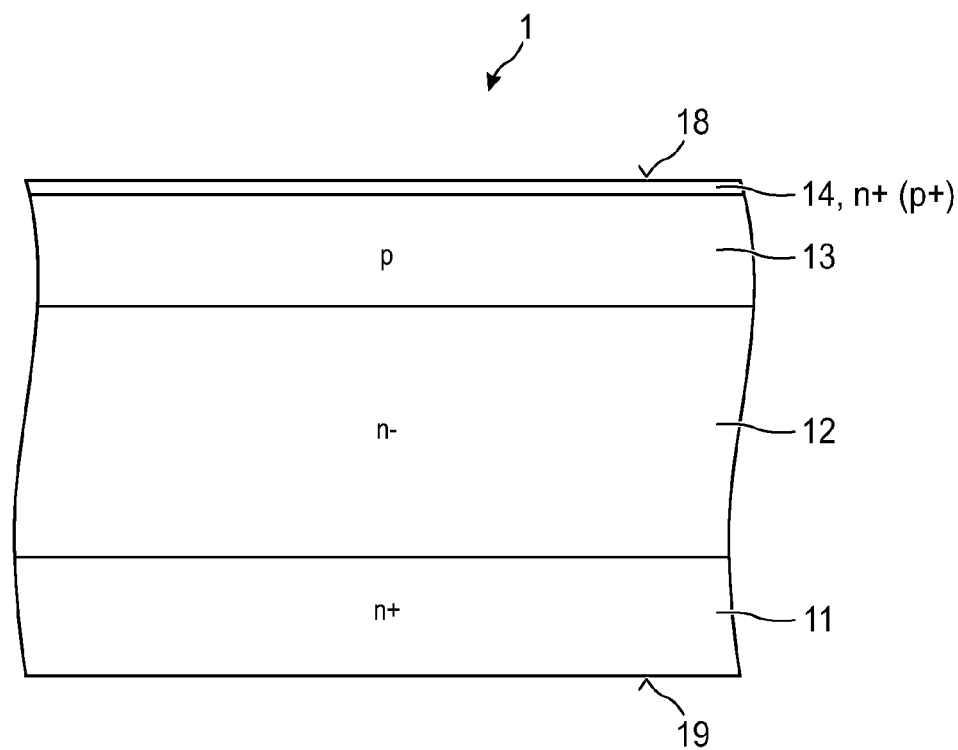

FIG. 1 schematically illustrates a vertical cross sectional view of a semiconductor body 1 with a top side 18 and a bottom side 19 opposite the top side 18. The cross sectional plane extends perpendicular to the top side 18 and to the bottom side 19. The semiconductor body 1 may include a conventional semiconductor material, such as silicon (Si), silicon carbide (SiC), gallium arsenide (GaAs), or any other semiconductor material.

Starting from the bottom side 19, the semiconductor body 1 may include an n-doped first semiconductor region 11, an n-doped second semiconductor region 12, a p-doped third semiconductor region 13 and an n-doped fourth semiconductor region 14 arranged on top of one another. However, in other embodiments, the semiconductor body 1 may have a different structure.

In order to produce trenches in the semiconductor body 1, a mask layer 61 is deposited on the top side 18 and a photoresist layer 62 is deposited on the mask layer 61. Then, the mask layer 61 is photolithographically structured with conventional techniques so as to have openings. Thereby, the photo resist layer 62 is used in the photolithography process. In a subsequent etching step, one or more first trenches 21 and one or more second trenches 22 are etched underneath the openings of the mask layer 61.

Figure 2:
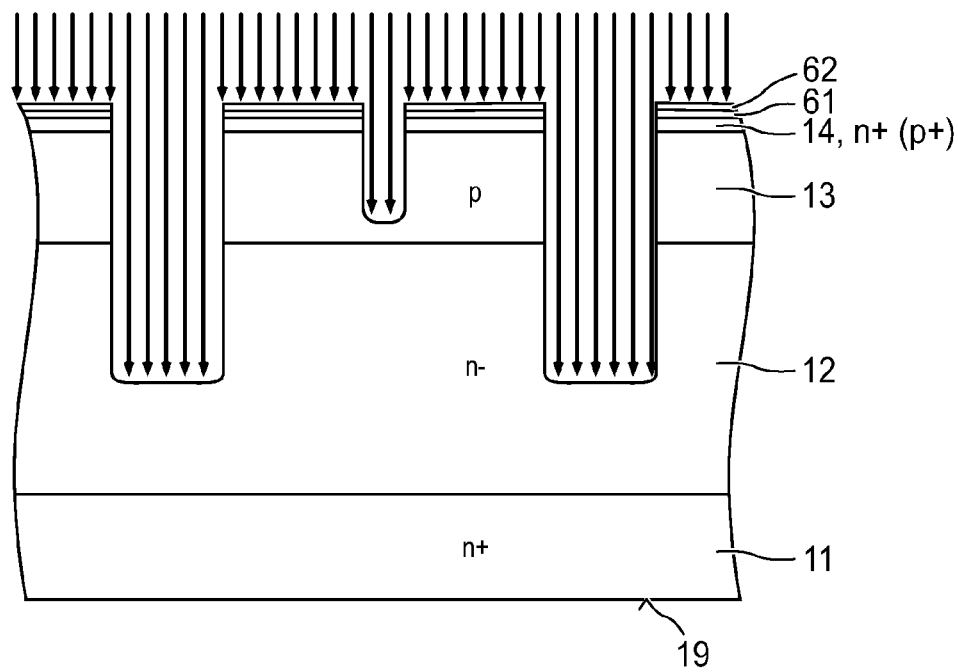

FIG. 2 illustrates the etching step. As indicated by a number of parallel arrows, the etching method employed may be an anisotropic etching method, for instance RIE (Reactive Ion Etching). The resulting depth of the first and second trenches 21, 22 depends on the width of the respective openings of the mask 61. More precisely, the depth of an etched trench increases with the width of the respective opening.

Figure 3:
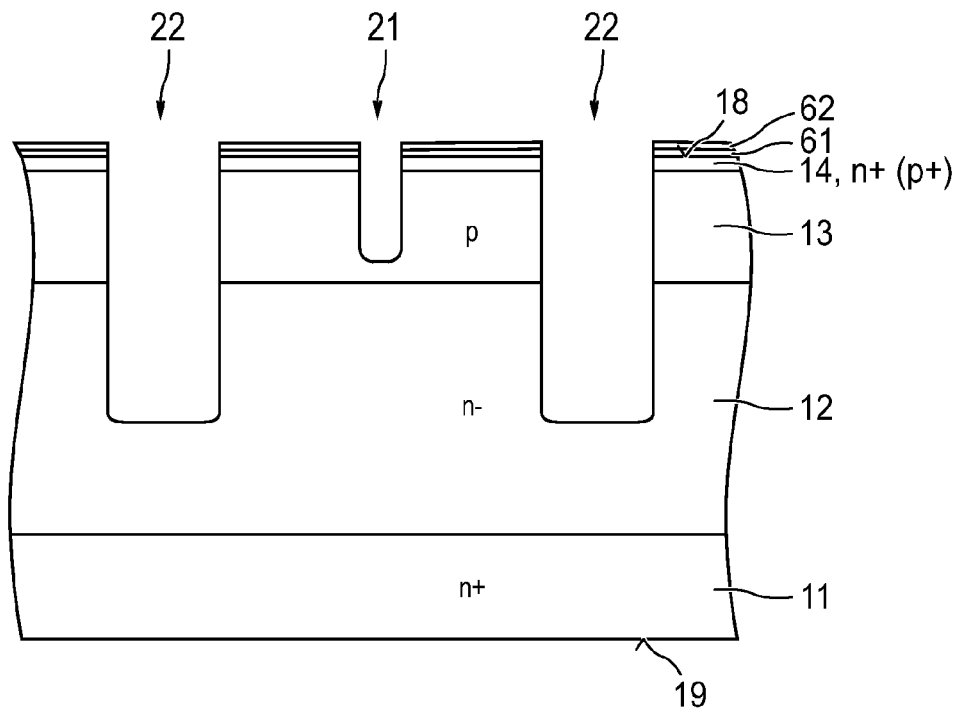
Figure 4:
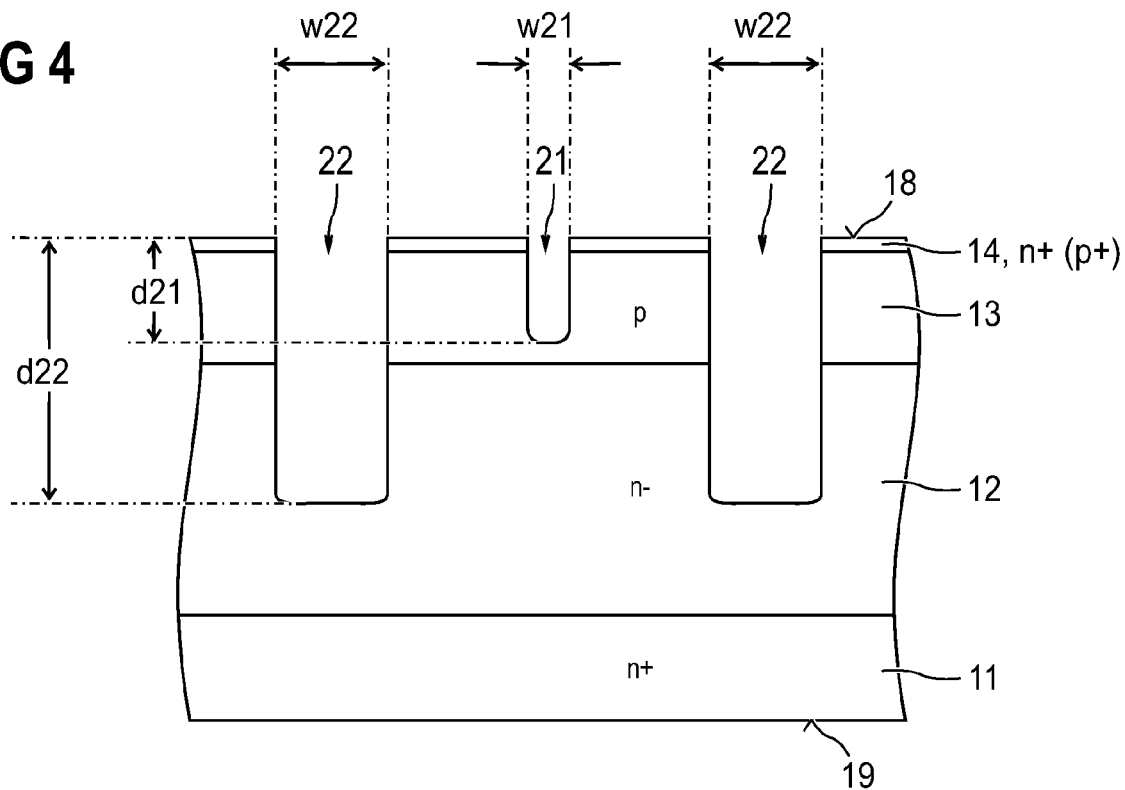

FIG. 3 illustrates the arrangement after the trench etching process. Then, as further illustrated in FIG. 4, the mask layer 61 and the photoresist layer 62 may optionally be partly or completely removed from the semiconductor body 1. In other embodiments, the mask layer 61 and/or the photoresist layer 62 may remain on the semiconductor body 1. As also illustrated in FIG. 4, relative to the top side 18 of the semiconductor body 1, the first trench 21 has a first depth d21 and the second trenches 22 have a second depth d22 greater than the first depth d21. Optionally, the ratio d22:d21 between the second depth d22 and the first depth d21 may be greater than 1.5

The completed first trench 21 protrudes from the top side 18 into the semiconductor body 1 and has a first width w21. Accordingly, the completed second trenches 22 protrude from the top side 18 into the semiconductor body 1 and have a second width w22 whereby the first width w21 is smaller than the second width w22.

Figure 5:
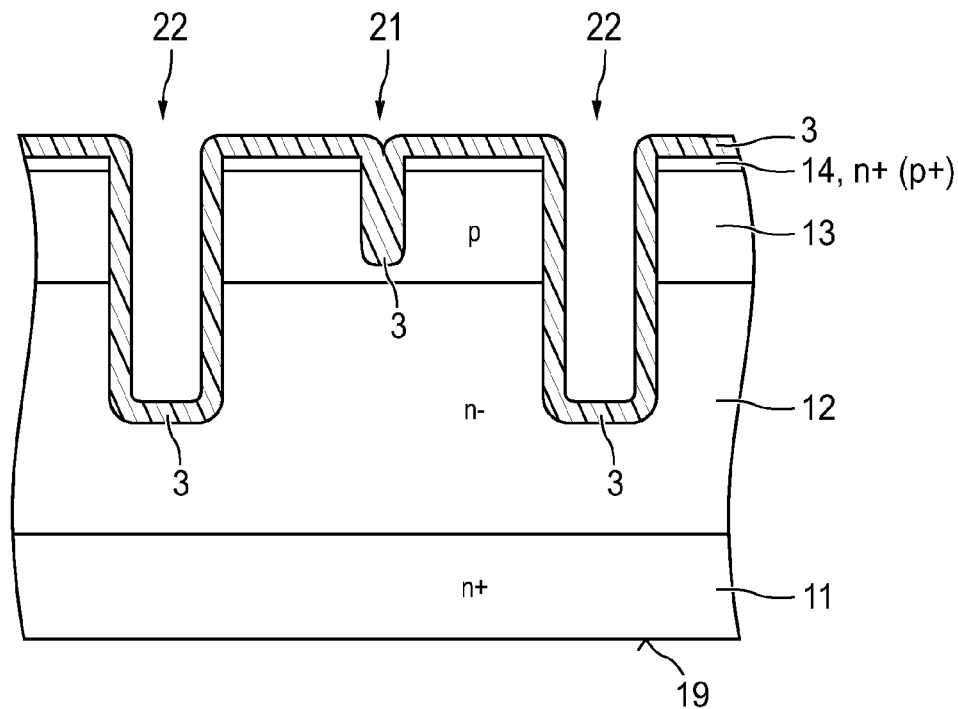

In a subsequent oxide formation process illustrated in FIG. 5, an oxide layer 3 is formed on the top side 18 such that the oxide layer 3 is arranged in the first trench 21 and in the second trenches 22. Thereby, the oxide layer 3 fills the first trench 21 and electrically insulates a surface of the second trenches 22. As can also be seen from FIG. 5, the first trench 21 is completely filled with the oxide of the oxide layer 3.

In principle, any know technique may be used for forming the oxide layer 3. For instance, the oxide layer 3 may be formed by depositing an oxide on the semiconductor body 1, e.g. in a TEOS (Tetraethyl orthosilicate) process in which silicon dioxide is deposited. A further possibility for forming the oxide layer 3 is oxidizing a surface layer of the semiconductor body 1. In case of a silicon semiconductor body 1, the result is an oxide layer 3 substantially comprising of silicon dioxide.

By filling the first trench 21, the oxide layer 3 seals and protects the first trench 21 so that one or more subsequent process steps can be carried out without adversely affecting the first trench 21 or those regions of the semiconductor body 1 adjacent to the first trench 21. By way of example, in the present embodiment the further process steps include forming a gate electrode 42 in each of the one or more second trenches 22. Optionally, in each of the one or more second trenches 22 a field electrode 41 may be produced and sealed with a dielectric layer 51 prior to forming the gate electrodes 42. The dielectric layer 51 serves to electrically insulate the gate electrode 42 to be produced from the field electrode 41 arranged in the same second trench 22 as the respective gate electrode 21. In other embodiments, the field electrode 41 and the gate electrode 42 may be electrically connected to one another.

Figure 6:
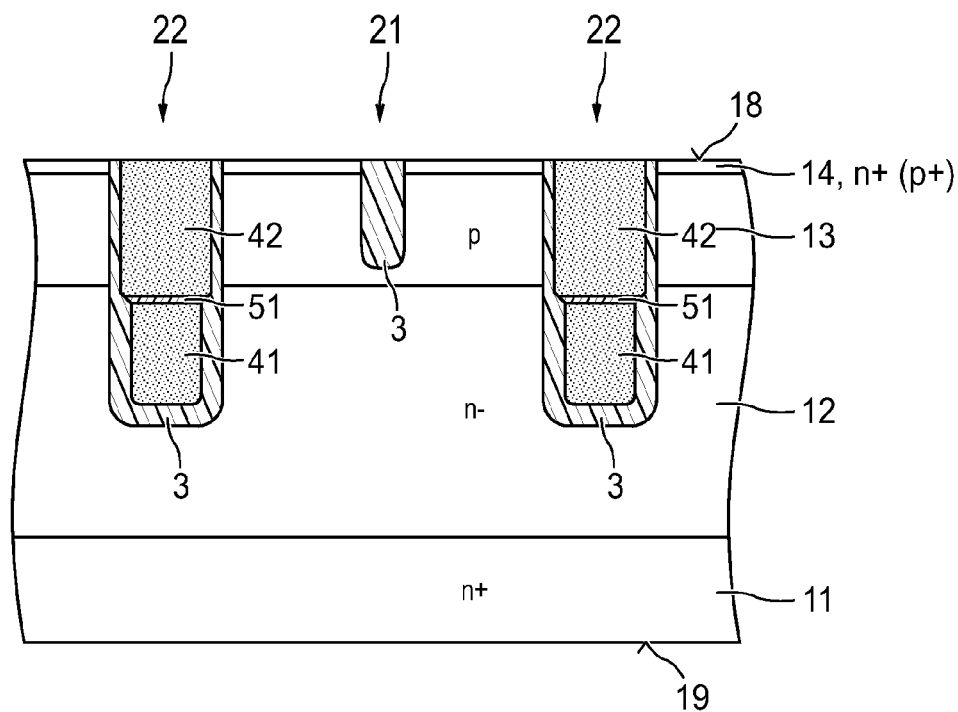

After the production of the gate electrodes 42, the arrangement may optionally be grinded and/or chemically-mechanically polished (CMP) at the top side 18 in order to remove excrescent parts of the filling material and/or of the oxide layer 3. The resulting structure is illustrated in FIG. 6.

Figure 7:
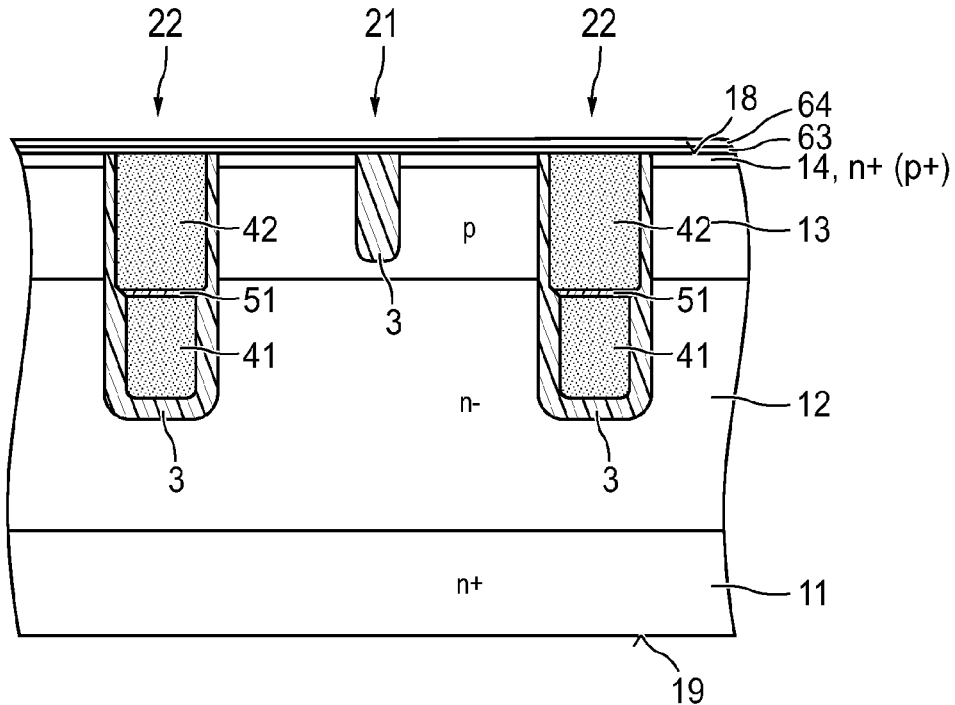
Figure 8:
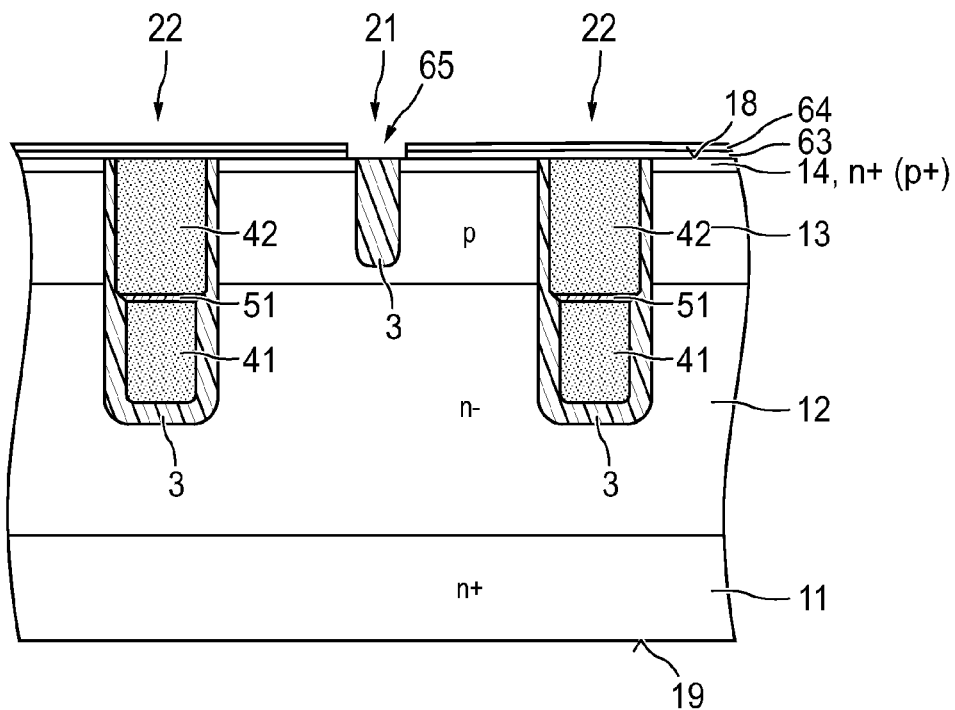

Subsequently, a mask layer 63 is deposited on the top side 18 and a photoresist layer 64 is deposited on the mask layer 63 as illustrated in FIG. 7. Then, as illustrated in FIG. 8, the mask layer 63 is photolithographically structured with conventional techniques so that the mask layer 63 has an opening 65 above each first trench 21. In a following etching step, the oxide layer 3 is completely or at least partly removed from each first trench 21 such that the semiconductor body 1 has an exposed first surface area 10 in the first trench 21. The first surface area 10 allows for electrically contacting the semiconductor body 1 inside the first trench 21. In the etching step, the structured mask layer 63 is used as an etching mask. For etching, both isotropic (e.g. wet etching) or anisotropic etching techniques may be used. The etching may take place selective relative to the semiconductor body 1 in order to substantially avoid removing material of the semiconductor body 1. FIG. 9 illustrates the resulting structure after the etching process is completed.

Then, a p-doped contact doping region 15 of the semiconductor body 1 may optionally be formed in the semiconductor body 1 adjacent to the surface of the first trench 21. That is, the p-doped contact doping region 15 extends as far as the surface of the first trench 21 and has a dopant concentration higher than a dopant concentration of the p-doped third semiconductor region 13. FIG. 10 illustrates the arrangement with the completed p-doped contact doping region 15.

Then, the mask layer 63 and/or the photoresist layer 64 may optionally be removed partly or completely from the top side 18. However, in other embodiments, the mask layer 63 and/or the photoresist layer 64 may remain on the top side 18.

Figure 11:
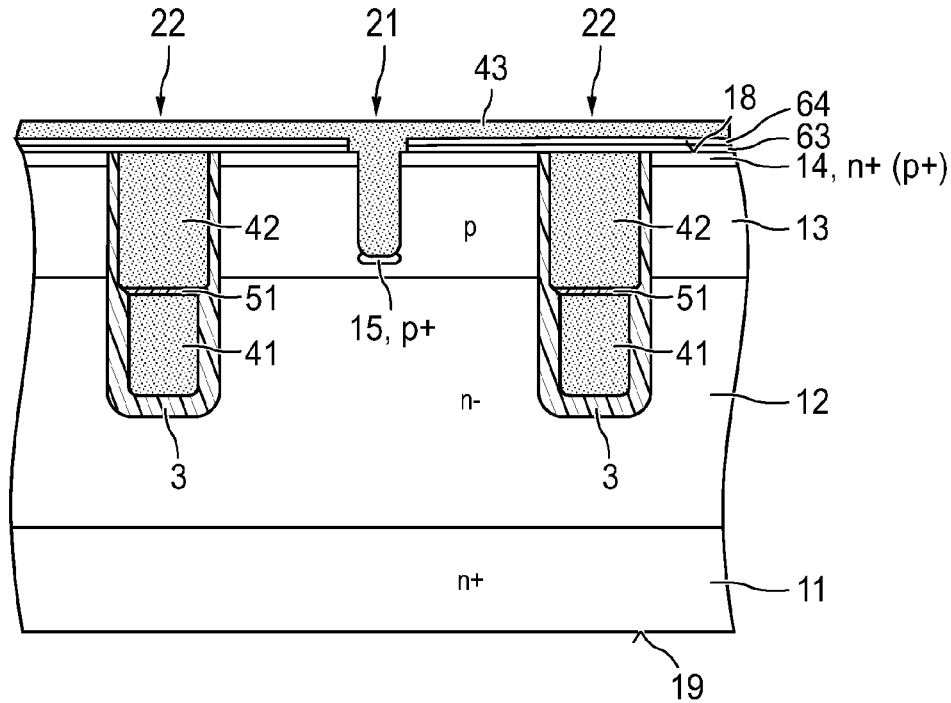

Subsequently, as illustrated in FIG. 11, an electrically conductive material 43 is deposited over the top side 18 and thereby in the first trench 21 such that it mechanically and electrically contacts the exposed first surface area 10. Provided that a p-doped contact doping region 15 has previously been produced, the electrically conductive material 43 also contacts the p-doped contact doping region 15. The electrically conductive material 43 may consist of or include one or both of a polycrystalline semiconductor material (e.g. polycrystalline silicon) and a metal (e.g. aluminum, copper, titanium, tungsten).

Figure 12:
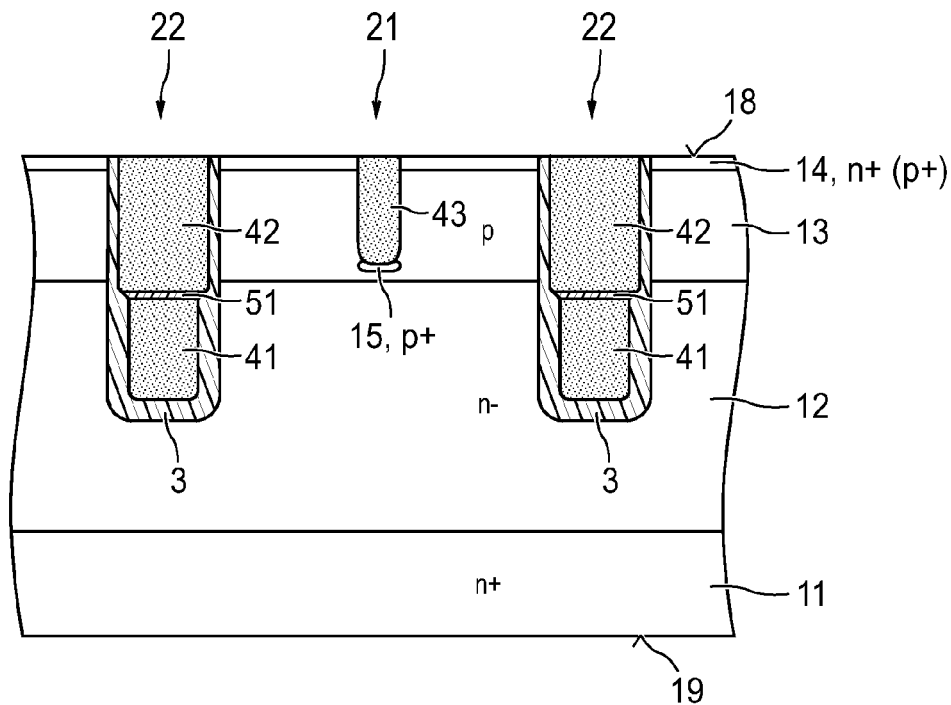

Referring now to FIG. 12, the parts of the conductive material 43 overlying the mask layer 63 may be removed partly or completely, for instance by grinding and/or chemically-mechanically polishing (CMP). Thereby, also the mask layer 63 and/or the photoresist layer 64 may be removed partly or completely.

Figure 13:
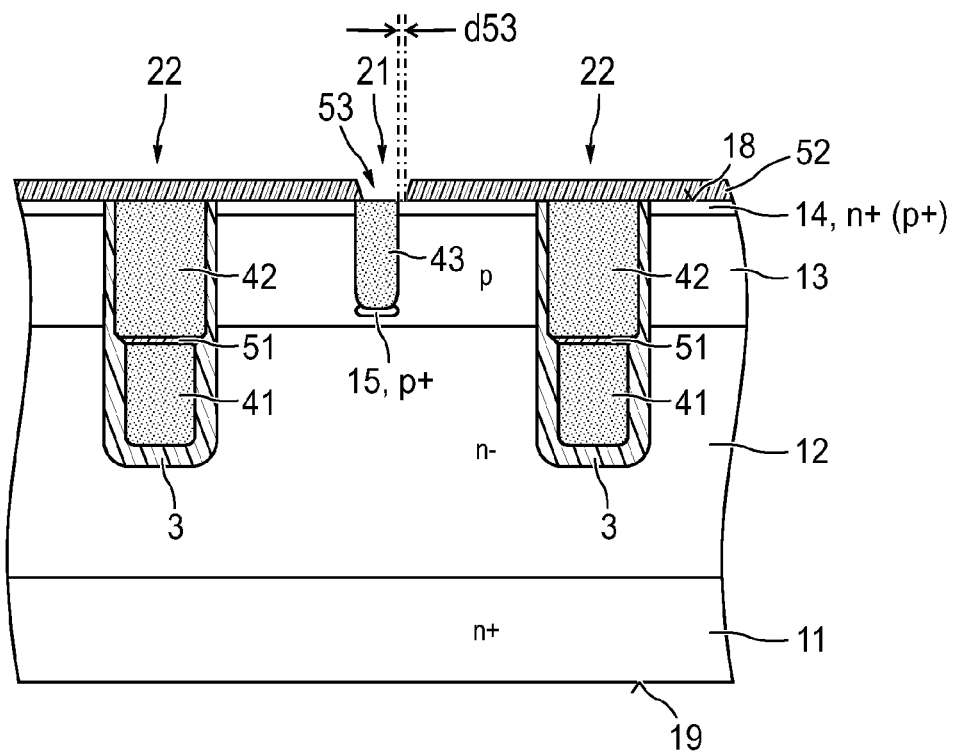
Figure 14:
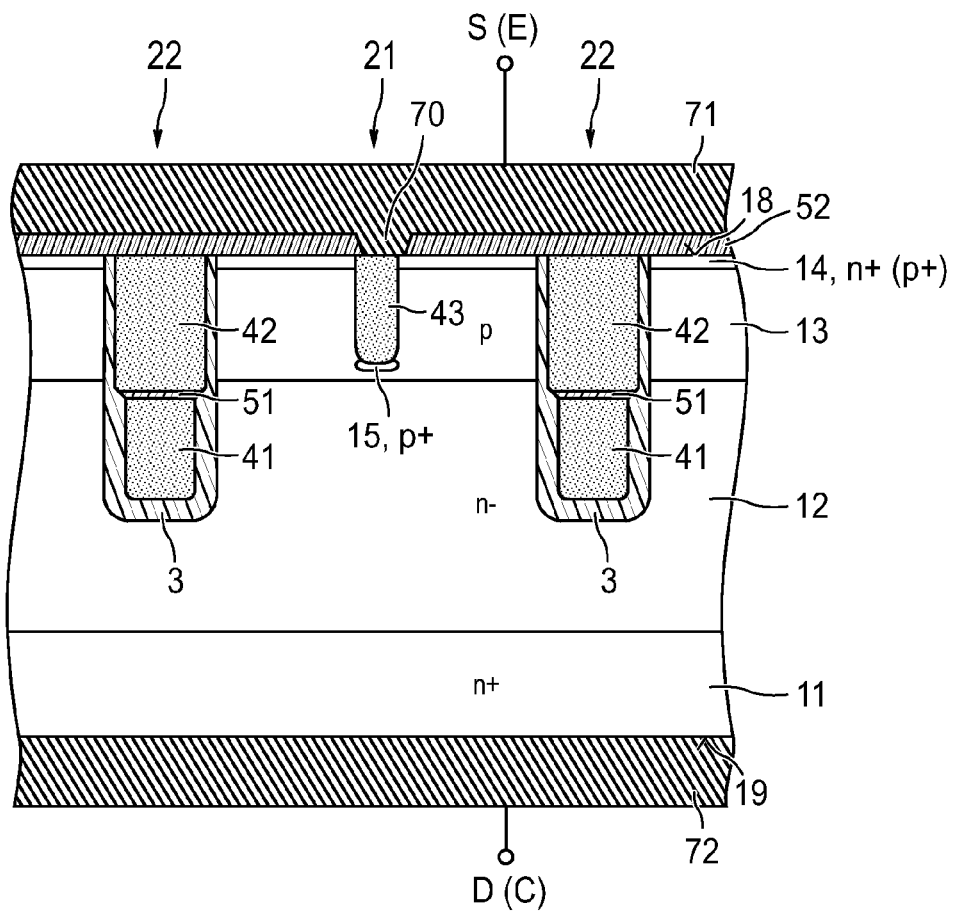

Then, as illustrated in FIG. 13, a dielectric layer 52 is deposited on the top side 18 and subsequently provided with an opening 53. The opening 53 is arranged above the electrically conductive material 43 such that the electrically conductive material 43 is exposed inside the opening 53. An electrically conductive material 71 is then deposited on the top side 18, and which also enters the opening 53 where it contacts the conductive material 43. The electrically conductive material 71 may be a metal (e.g. aluminum, copper, titanium, tungsten) or a doped or undoped polycrystalline semiconductor material (e.g. polycrystalline silicon). In the present embodiment, the electrically conductive material 71 forms a source contact electrode S with a protrusion 70 that is arranged in the opening 53 where it contacts the electrically conductive material 43 so that it is electrically connected to the first surface area 10, to the third semiconductor region 13, and, if provided, to the contact doping region 15.

Prior to, together with or after the deposition of the electrically conductive material 71, an electrically conductive material 72 may be deposited on the bottom side 19 and mechanically and electrically contact the first semiconductor region 11. The electrically conductive materials 71 and 72 may be identical. In the present embodiment, the electrically conductive material 72 forms a drain contact electrode D.

In the completed component of the described embodiment, the n-doped first semiconductor region 11 is a drain region, the n-doped second semiconductor region 12 is a drift region, the p-doped third semiconductor region 13 is a body region, the n-doped fourth semiconductor region 14 is a source region, and the p-doped semiconductor region 15 is a body contact region.

Figure 20:
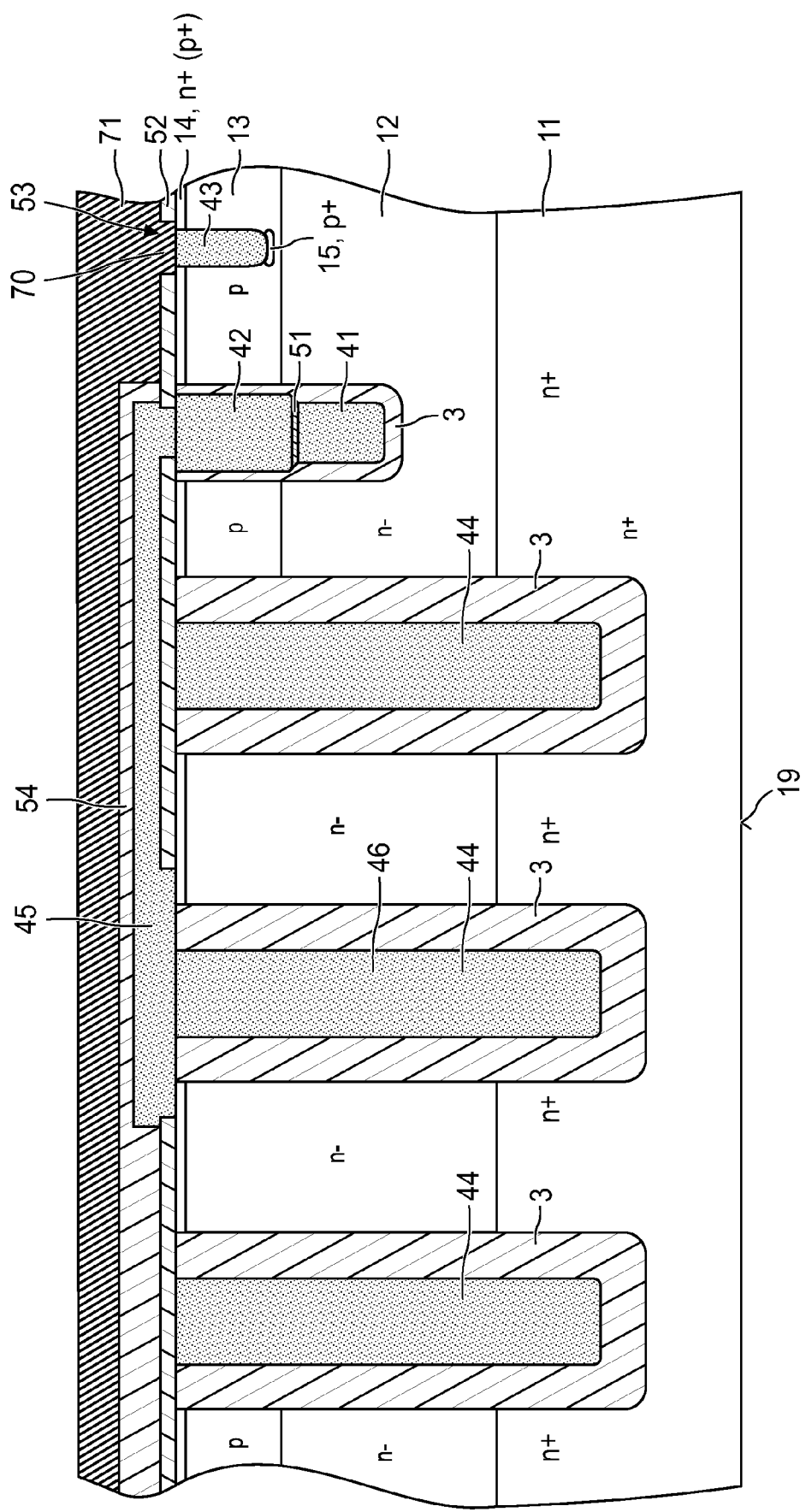
Figure 21:
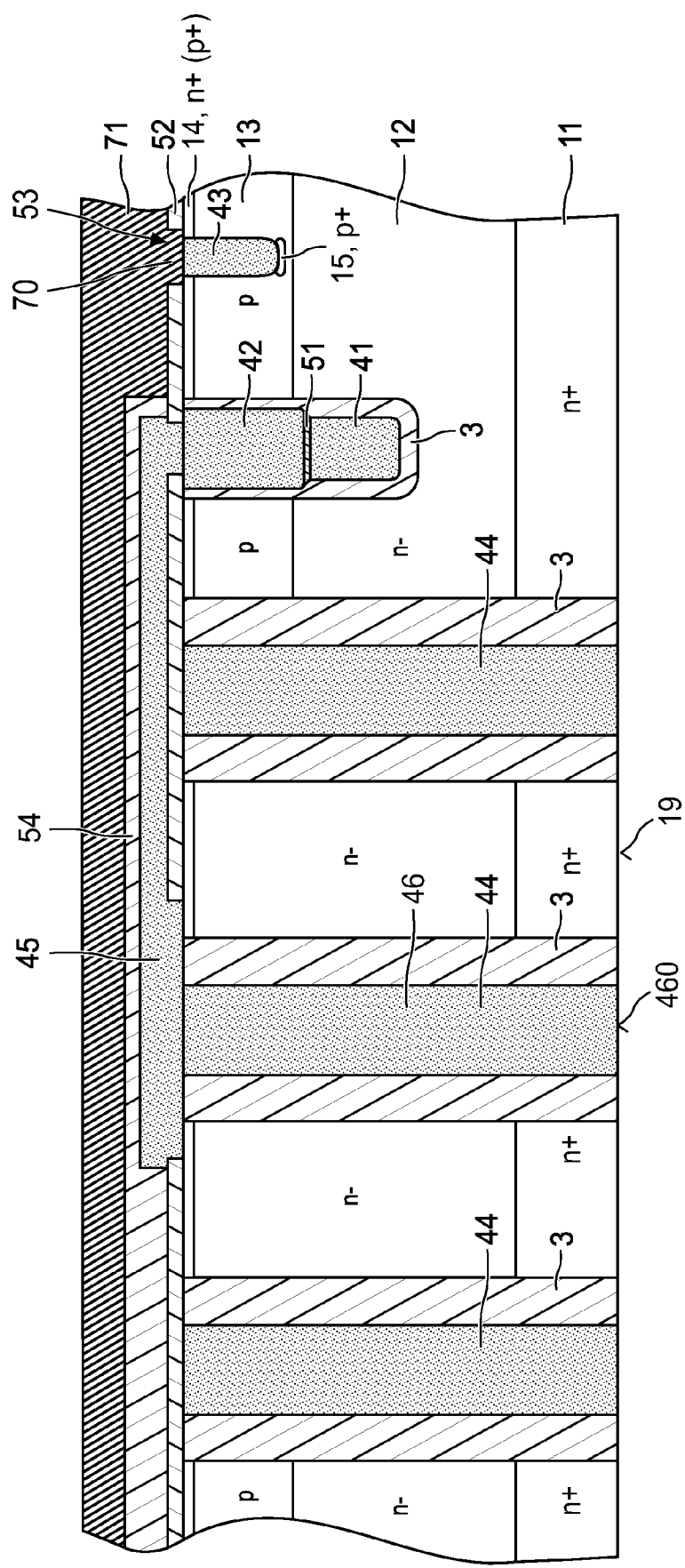
Figure 22:
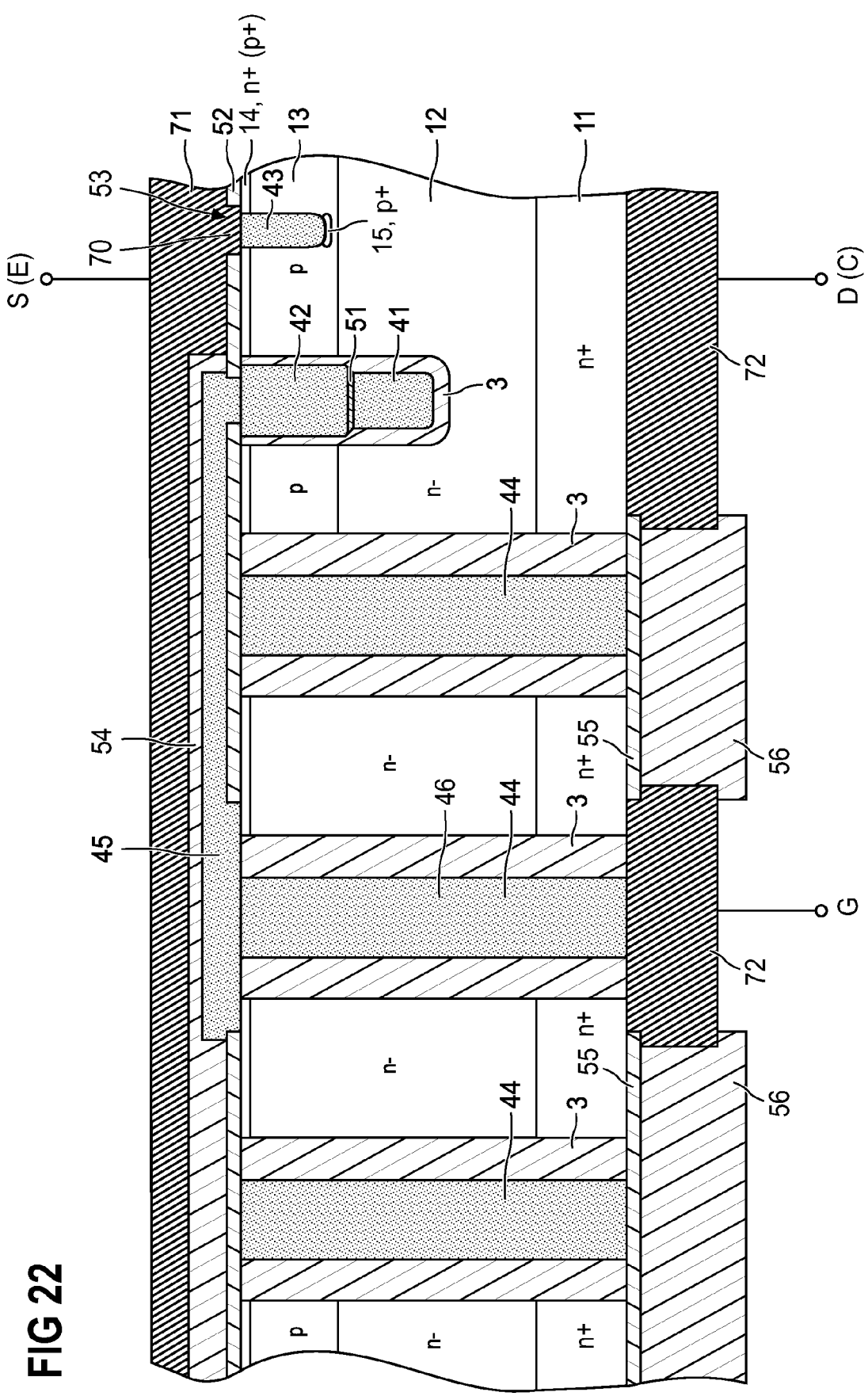

A further embodiment of a method for producing a controllable semiconductor component will now be described with reference to FIGS. 15 to 22. The completed component is illustrated in FIG. 22. The component differs from the component described with reference to FIGS. 1 to 14 in that the gate electrode 42 is electrically connected to a gate contact electrode G arranged on the bottom side 19 of the semiconductor body 1. To this end, an electrically conductive via 46, e.g. a semiconductor via, completely penetrates the semiconductor body 1 between the top side 18 and the bottom side 19. At the bottom side 19, the via 46 electrically contacts the gate contact electrode G. In addition, an electrically conductive line 45 arranged on the top side 18 electrically connects both the gate electrode 42 and the via 46. Hence, the gate electrode 42 is electrically connected to the gate contact electrode G via the conductive line 45 and the via 46.

Figure 15:
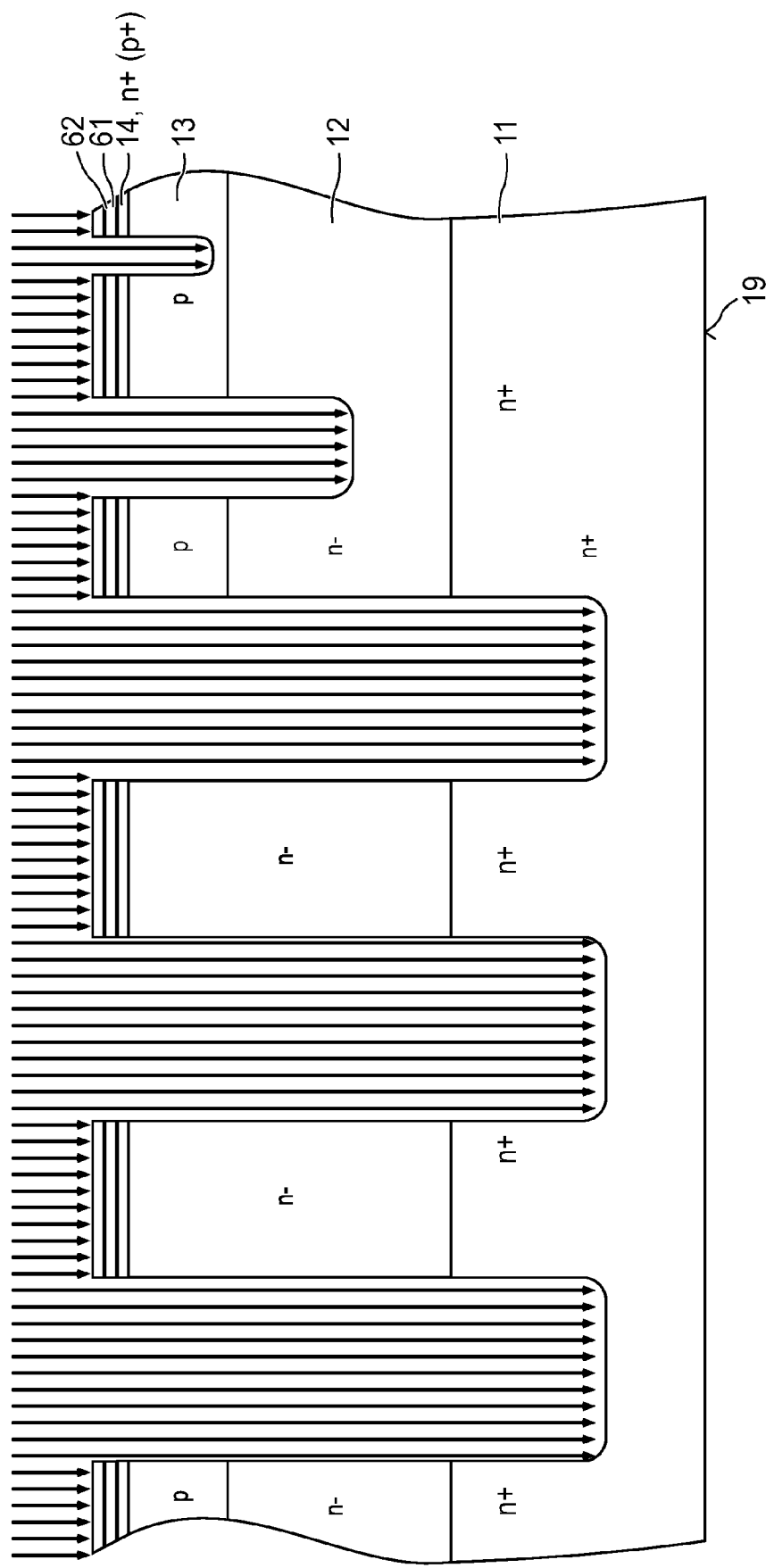
FIGS. 15-22 illustrate different steps during the production of a further controllable semiconductor component.

In order to produce such a semiconductor component with the drain contact electrode 72 arranged on the bottom side 19, a semiconductor body 1 as illustrated in and described with reference to FIG. 1 is provided. Then, a mask layer 61 is deposited on the top side 18 and a photoresist layer 62 is deposited on the mask layer 61 as described with reference to FIG. 2. Then, the mask layer 61 is photolithographically structured with conventional techniques so as to have openings. Thereby, the photo resist layer 62 is used in the photolithography process. In a subsequent etching step, one or more first trenches 21, one or more second trenches 22 and one or more third trenches 23 are etched underneath the openings of the mask layer 61. FIG. 15 illustrates the etching step. As indicated by a number of parallel arrows, the used etching method may be an anisotropic etching method, for instance RIE (Reactive Ion Etching).

Figure 16:
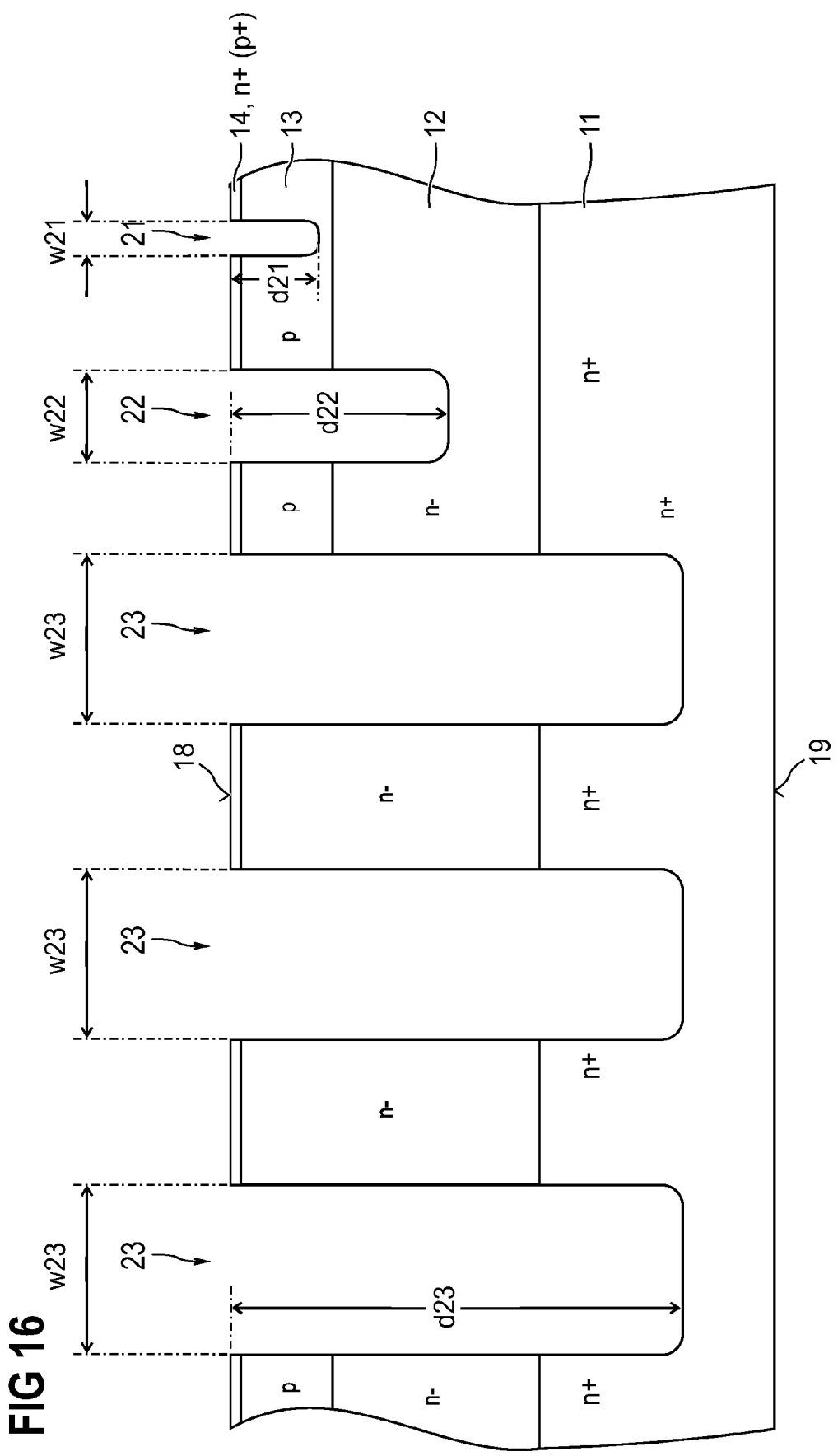

FIG. 16 illustrates the arrangement after the trench etching process and after the optional removal of the photoresist layer 62 and of the mask layer 61. Alternatively, the mask layer 61 and the photoresist layer 62 may remain on the semiconductor body 1 or be removed only partly from the semiconductor body 1.

The completed first trenches 21 protrude from the top side 18 into the semiconductor body 1 and have first widths w21 and, relative to the top side 18, first depths d21. The completed second trenches 22 protrude from the top side 18 into the semiconductor body 1 and have second widths w22 and, relative to the top side 18, second depths d22, and the completed third trenches 23 protrude from the top side 18 into the semiconductor body 1 and have third widths w23 and, relative to the top side 18, third depths d23. Thereby, the first width w21 is smaller than the third width w23. Optionally, the second width w23 may be greater than the first width w21 and smaller than the third width w23. Further, the first depth d21 is smaller than the third depth d23. Optionally, the second depth d22 may be greater than the first depth d21 and smaller than the third depth d23. Optionally, the ratio d22:d21 between the second depth d22 and the first depth d21 may be greater than 1.5. Also optionally, the ratio d23:d21 between the third depth d23 and the first depth d21 may be greater than 1.5. According to a further option, the ratio d23:d21 between the third depth d23 and the first depth d21 may be greater than 1.5.

Figure 17:
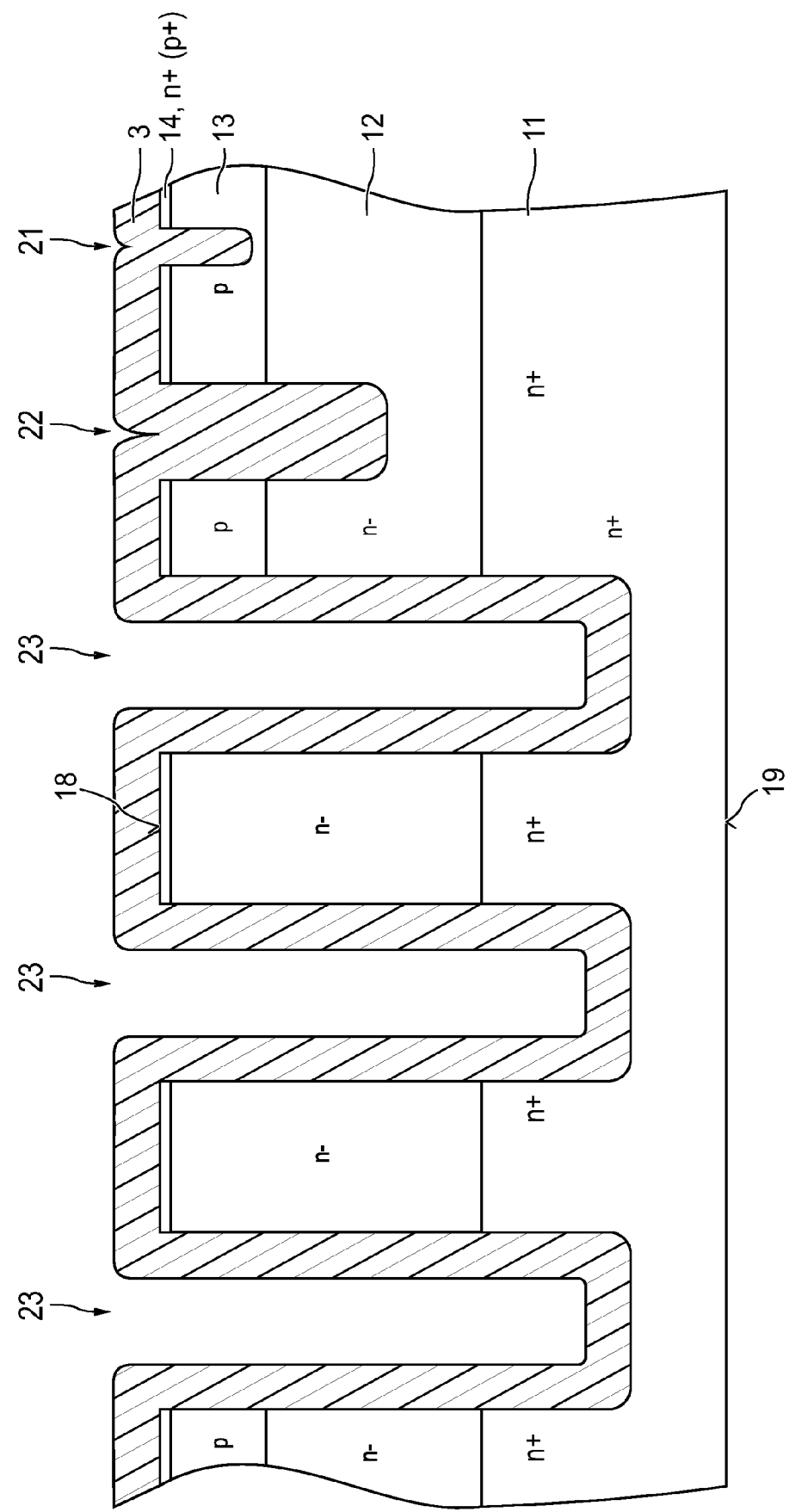

In a subsequent oxide formation process illustrated in FIG. 17, an oxide layer 3 is formed on the top side 18 such that the oxide layer 3 is arranged in the first trenches 21, in the second trenches 22 and in the third trenches 23. Thereby, the oxide layer 3 fills the first trench 21 and electrically insulates a surface of the third trenches 23. Thereby, the oxide layer 3 may either fill—as illustrated in FIG. 17—the second trenches 22, or only insulate the surface of the second trenches 22 in the same manner as described above with reference to the second trenches 22 illustrated in FIG. 5.

In principle, any known technique may be used for forming the oxide layer 3. For instance, the oxide layer 3 may be formed by depositing an oxide on the semiconductor body 1, e.g. in a TEOS (Tetraethyl orthosilicate) process in which silicon dioxide is deposited. A further possibility for forming the oxide layer 3 is oxidizing a surface layer of the semiconductor body 1. In case of a silicon semiconductor body 1, the result is an oxide layer 3 substantially comprising of silicon dioxide.

By filling the first trenches 21 and, optionally, the second trenches 22, the oxide layer 3 seals and protects the first trench 21 and, if the second trenches 22 are also filled with the oxide layer 3, the second trenches 22, so that one or more subsequent process steps can be carried out without adversely affecting the first trenches 21 or the regions of the semiconductor body 1 adjacent to the first trenches 21, and, if the second trenches 22 are also filled with the oxide layer 3, without adversely affecting the second trenches 22 or the regions of the semiconductor body 1 adjacent to the second trenches 22.

Figure 18:
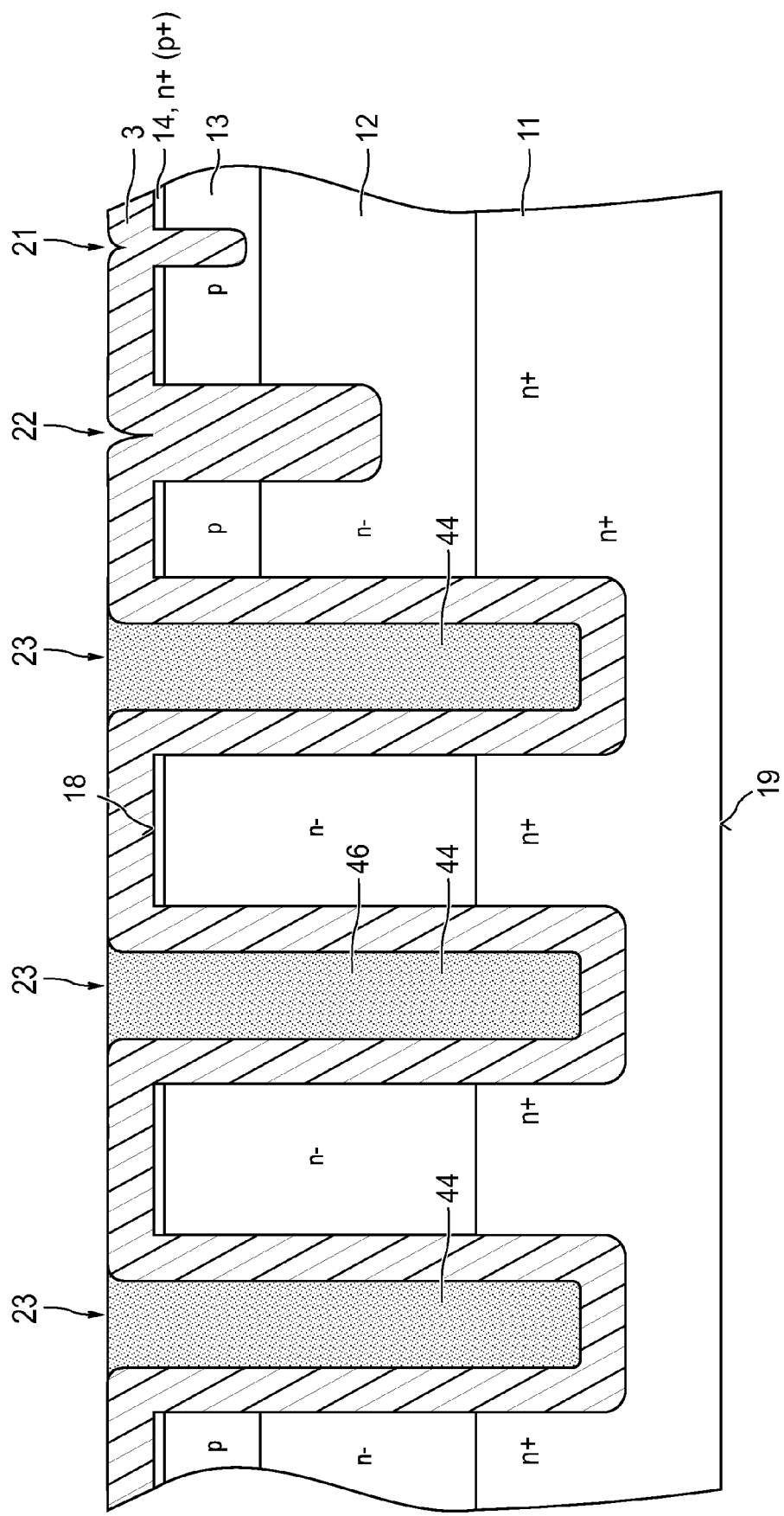

By way of example, in the present embodiment the further process steps include filling the third trenches 23 with an electrically conductive material 44, for instance a doped or undoped semiconductor material (e.g. polycrystalline silicon) or a metal (e.g. aluminum, copper, titanium, tungsten). The resulting structure is illustrated in FIG. 18. In alternative embodiments in which the second trenches 22 are not completely filled with the oxide layer 3, the electrically conductive material 44 may also be filled into the second trenches 22, for instance for forming common gate and source electrodes in the second trenches 22. However, in the illustrated embodiment, the first and second trenches 21, 22 remain filled with and protected by the oxide layer 3.

Subsequently, the oxide layer 3 may be partly removed from each of the one or more second trenches 22 in order to allow for the formation of gate electrodes 42 inside the second trenches 22. Optionally, in each of the second trenches 22, a field electrode 41 and the optional dielectric layer 51 may be produced prior to forming the gate electrodes 42.

Also subsequent to filling the third trenches 23 with the electrically conductive material 44, the oxide layer 3 may be removed from each of the one or more first trenches 21 and an electrically conductive material 43 may be deposited in the first trenches 21. Thereby, the electrically conductive material 43 contacts exposed first surface areas 10 inside the first trenches 21 as already described with reference to FIGS. 9 to 11. Removing the oxide layer 3 from the first trenches 21 may take place using a photolithographically mask layer 63 provided with openings 65 above each of the first trenches 21 as already described with reference to FIGS. 7 to 9.

Figure 19:
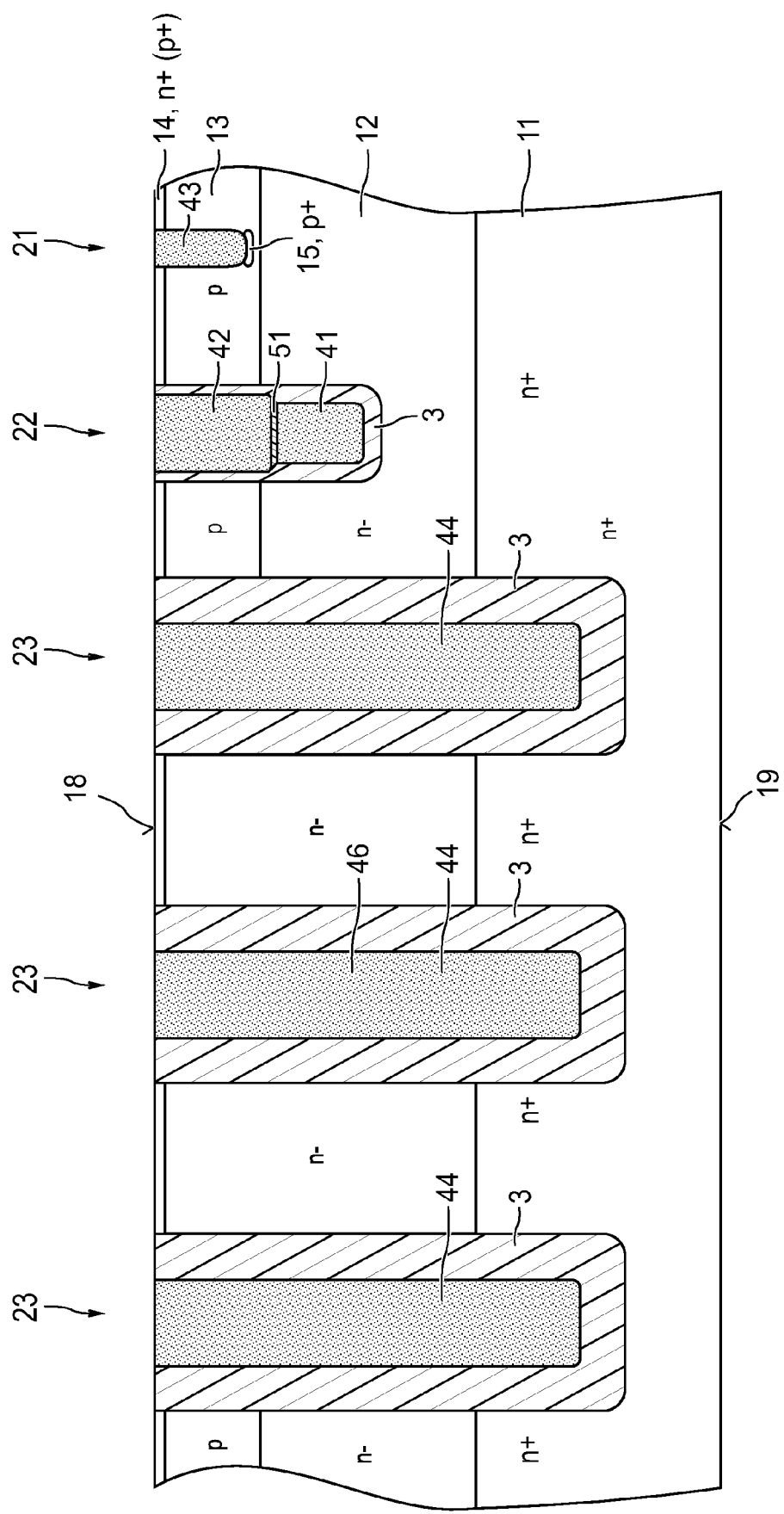

Provided that p-doped contact doping regions 15 have previously been produced, the electrically conductive material 43 also contacts the p-doped contact doping regions 15 inside the first trenches 21. The electrically conductive material 43 may consist of or include one or both of a polycrystalline semiconductor material (e.g. polycrystalline silicon) or a metal (e.g. aluminum, copper, titanium, tungsten). The resulting structure is illustrated in FIG. 19.

Subsequently, a dielectric layer 52 is deposited on the top side 18 and provided with openings above the second trenches 22 and above at least one third trench 23 such that gate electrodes 42 and the electrically conductive material 44 in at least one of the third trenches 23 are exposed. Then, an electrically conductive line 45 electrically connecting the exposed gate electrodes 42 and the exposed electrically conductive material 44 is produced. The electrically conductive line 45 may be made of doped or undoped polycrystalline semiconductor material (e.g. polycrystalline silicon) or of metal (e.g. aluminum, copper, titanium, tungsten). Alternatively, the electrically conductive line 45 may be formed from the electrically conductive material that forms the gate electrodes 42. In this case, the electrically conductive material is deposited on the top side 18 such, that the gate electrodes 42 are produced and that it overlays the top side 18. Then, the overlaying parts of the electrically conductive material are structured such that gate electrodes 42 and the electrically conductive line 45 remain.

Then, the electrically conductive line 45 is electrically insulated with a further dielectric layer 54, and an electrically conductive material 71 is deposited on the top side 18. Prior to depositing the electrically conductive material 71, the dielectric layer 52 is provided with an opening 53 above each of the first trenches 21. This allows for the deposited electrically conductive material 71 to enter the openings 53 and to electrically and mechanically contact the conductive material 43. The electrically conductive material 71 may be a doped or undoped polycrystalline semiconductor material (e.g. polycrystalline silicon) or a metal (e.g. aluminum, copper, titanium, tungsten). In the present embodiment, the electrically conductive material 71 forms a source contact electrode S with a protrusion 70 that is arranged in the openings 53 where it contacts the electrically conductive material 43 so that it is electrically connected to the first surface area 10, to the third semiconductor region 13, and, if provided, to the contact doping regions 15. The resulting structure is illustrated in FIG. 20.

As the component described with reference to FIG. 22 requires the via 46 to electrically contact the gate contact electrode G still to be produced, the arrangement is grinded and/or chemically-mechanically polished (CMP) at the bottom side 19 in order to expose the electrically conductive material 44 of the via 46 at the bottom side 19. The resulting structure is illustrated in FIG. 21 with an exposed surface area 460 of the electrically conductive material 44.

Prior to, together with or after the deposition of the electrically conductive material 71 on the top side 18, an electrically conductive material 72 may be deposited on the bottom side 19 and mechanically and electrically contact the first semiconductor region 11 and/or the electrically conductive material 44. The electrically conductive material 72 may include two sections electrically insulated from one another: the drain contact electrode D mechanically and electrically contacting the first semiconductor region 11; and the gate contact electrode G mechanically and electrically contacting the exposed surface area 460.

Prior to depositing the electrically conductive material 72, structured dielectric layers 55 and 56 may optionally be produced on the bottom side 19 in order to electrically insulate in particular the drain contact electrode D against the gate contact electrode G.

In the completed component of the described embodiment, the n-doped first semiconductor region 11 is a drain region, the n-doped second semiconductor region 12 is a drift region, the p-doped third semiconductor region 13 is a body region, the n-doped fourth semiconductor region 14 is a source region, and the p-doped semiconductor region 15 is a body contact region.

In all embodiments of the invention relating to a controllable semiconductor switch, the doping concentrations of the first semiconductor region 11 and the fourth semiconductor region 14 may be, for instance, in a range of between $10^{19}$ cm$^{-3}$ and $10^{21}$ cm$^{-3}$. The doping concentration of the drift region 12 may be, for instance, in a range of between $10^{13}$ cm$^{-3}$ and $2\cdot 10^{17}$ cm$^{-3}$, and the doping concentration of the body region 13 may be, for instance, in a range of between $10^{16}$ cm$^{-3}$ and $10^{18}$ cm$^{-3}$.

In the embodiments described above, the components are MOSFETs. However, the explained principles also apply to other components. An example for such a component is an IGBT which differs from a MOSFET only in that the first semiconductor region 11 of the IGBT has a doping complementary to the doping of the first semiconductor region 11 of a MOSFET, that is, "p" instead of "n" in case of n-channel components and "n" instead of "p" in case of p-channel components. As commonly known in the art, the nomenclature between MOSFETs and IGBTs differs in that the drain region 11 and the source region 14 of a MOSFET correspond to a collector region 11 and an emitter region 14, respectively, of an IGBT. Accordingly, the drain contact electrode D and the source contact electrode S of a MOSFET correspond to a collector contact electrode C and an emitter contact electrode E, respectively, of an IGBT. Insofar there is a difference between the MOSFETs described in the drawings and a corresponding IGBT, the reference signs valid for the IGBTs are supplementary shown in parenthesis.

Instead of the described (vertical) n-channel components, also (vertical) p-channel components may be produced in the same manner. To this, the doping of the first, second, third and fourth semiconductor regions 11, 12, 13, 14 and of the contact doping region 15 should be inverted, that is, an n-doping is to be replaced by a p-doping and a p-doping is to be replaced by an n-doping.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Expressions like "subsequently", "then", "following" etc. used in the above specification are only intended to express that a certain step is carried out later than a previous step.

Nevertheless, one or more additional steps may be carried out after the previous step and prior to the certain step.

What is claimed is:

1. A method for producing a controllable semiconductor component, the method comprising:
   providing a semiconductor body with a top side and a bottom side;
   forming, in a common etching process, a first trench protruding from the top side into the semiconductor body and a second trench protruding from the top side into the semiconductor body, the first trench comprising a first width and a first depth, and the second trench comprising a second width greater than the first width and a second depth greater than the first depth;
   forming, in a common process, an oxide layer in the first trench and in the second trench such that the oxide layer fills the first trench and electrically insulates a surface of the second trench; and
   removing the oxide layer from the first trench completely or at least partly such that the semiconductor body comprises an exposed first surface area arranged in the first trench.

2. The method as claimed in claim 1, wherein the second trench is not completely filled with the oxide layer in the common process of forming the oxide layer in the first trench and in the second trench, and wherein a first electrode is formed on the top side, the first electrode electrically connected to the exposed first surface area.

3. The method as claimed in claim 2, wherein the first electrode comprises a protrusion arranged in the first trench and that contacts the exposed first surface area.

4. The method as claimed in claim 1, wherein the common process for forming the oxide layer is one of:
   a deposition process in which an oxide is deposited on the semiconductor body; or
   an oxidation process in which a surface layer of the semiconductor body is oxidized.

5. The method as claimed in claim 1, wherein the exposed first surface area is formed by a source region.

6. The method as claimed in claim 1, further comprising:
   forming a gate electrode in the second trench such that the oxide layer electrically insulates the gate electrode from the semiconductor body.

7. The method as claimed in claim 6, wherein the gate electrode comprises at least one of metal and doped polycrystalline semiconductor material.

8. The method as claimed in claim 6, further comprising:
   forming a field electrode in the second trench prior to forming the gate electrode.

9. The method as claimed in claim 8, wherein the field electrode comprises at least one of metal and doped polycrystalline semiconductor material.

10. The method as claimed in claim 1, wherein:
    the semiconductor body comprises an n-doped drain region, an n-doped drift region, a p-doped body region and an n-doped or p-doped source region arranged on top of one another; and
    the first trench extends through the source region into the body region.

11. The method as claimed in claim 10, further comprising:
    forming a second electrode contacting the drain region on the bottom side.

12. The method as claimed in claim 10, wherein:
    the second trench extends through the source region, the body region and the drift region and protrudes into the drain region.

13. The method as claimed in claim 10, further comprising:
    filling an electrically conductive material into the second trench; and
    partially removing the drain region and the oxide layer such that the electrically conductive material comprises an exposed second surface area at the bottom side.

14. The method as claimed in claim 13, further comprising:
    forming a third electrode on the bottom side, the third electrode being electrically connected to the exposed second surface area.

15. A method for producing a controllable semiconductor component, the method comprising:
    providing a semiconductor body with a top side and a bottom side;
    forming, in a common etching process, a first trench protruding from the top side into the semiconductor body, a second trench protruding from the top side into the semiconductor body, and a third trench protruding from the top side into the semiconductor body, the first trench comprising a first width and a first depth, the second trench comprising a second width and a second depth and the third trench comprising a third width and a third depth, both the first width and the second width being smaller than the third width, and the first depth being smaller than one or both of the second depth and the third depth;
    forming, in a common process, an oxide layer in the first trench, in the second trench and in the third trench such that the oxide layer fills the first trench and the second trench and electrically insulates a surface of the third trench; and
    removing the oxide layer from the first trench completely or at least partly such that the semiconductor body comprises an exposed first surface area arranged in the first trench.

16. The method as claimed in claim 15, wherein the third trench is not completely filled with the oxide layer in the common process of forming the oxide layer in the first trench, in the second trench and in the third trench, and wherein a first electrode is formed on the top side, the first electrode electrically connected to the exposed first surface area.

17. The method as claimed in claim 16, wherein the first electrode comprises a protrusion arranged in the first trench and that contacts the exposed first surface area.

18. The method as claimed in claim 15, wherein the common process for forming the oxide layer is one of:
    a deposition process in which an oxide is deposited on the semiconductor body; or
    an oxidation process in which a surface layer of the semiconductor body is oxidized.

19. The method as claimed in claim 15, further comprising:
    forming a gate electrode in the second trench such that the oxide layer electrically insulates the gate electrode from the semiconductor body.

20. The method as claimed in claim 19, further comprising:
    forming a field electrode in the second trench prior to forming the gate electrode.

21. The method as claimed in claim 15, wherein:
    the semiconductor body comprises an n-doped drain region, an n-doped drift region, a p-doped body region and an n-doped or p-doped source region arranged on top of one another;
    the first trench extends through the source region into the body region; and
    the exposed first surface area is formed by the source region.

22. The method as claimed in claim 21, further comprising:
forming a second electrode contacting the drain region on the bottom side.

23. The method as claimed in claim 21, wherein:
the third trench extends through the source region, the body region and the drift region and protrudes into the drain region.

24. The method as claimed in claim 21, further comprising:
filling an electrically conductive material into the third trench; and
partially removing the drain region and the oxide layer such that the electrically conductive material comprises an exposed second surface area at the bottom side.

25. The method as claimed in claim 24, further comprising:
forming a third electrode on the bottom side, the third electrode being electrically connected to the exposed second surface area.

* * * * *